(12) United States Patent
Nakamura (10) Patent No.: US 6,456,128 B1
(45) Date of Patent: Sep. 24, 2002

(54) OVERSAMPLING CLOCK RECOVERY CIRCUIT

(75) Inventor: Satoshi Nakamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/847,311

(22) Filed: May 3, 2001

(30) Foreign Application Priority Data

May 11, 2000 (JP) ........................................ 2000-139089

(51) Int. Cl.[7] ................................................ H03L 7/06
(52) U.S. Cl. ...................................... 327/149; 327/144
(58) Field of Search ................................ 327/144, 146, 327/148, 165, 3, 9, 149; 375/376, 326

(56) References Cited

U.S. PATENT DOCUMENTS

| | | | | |
|---|---|---|---|---|
| 5,521,948 A | * | 5/1996 | Takeuchi | 375/376 |
| 5,963,606 A | * | 10/1999 | Drost et al. | 375/371 |
| 6,026,134 A | * | 2/2000 | Duffy et al. | 327/12 |
| 6,041,090 A | * | 3/2000 | Chen | 375/376 |
| 6,124,762 A | * | 9/2000 | Yoshida | 327/149 |
| 6,130,584 A | * | 10/2000 | Yoshida | 327/149 |

FOREIGN PATENT DOCUMENTS

JP 10-4349 1/1998

* cited by examiner

Primary Examiner—Kenneth B. Wells
Assistant Examiner—Cassandra Cox
(74) Attorney, Agent, or Firm—McGinn & Gibb, PLLC (57) ABSTRACT

Differential clocks CLKa, CLKb are supplied, and controlled in phase by a phase control circuit. Based on differential clocks CLKa, CLKb that have been controlled in phase by the phase control circuit, a delay-locked loop (DLL) generates 16-phase clocks CLK1 through CLK16, and supplies generated 16-phase clocks CLK1 through CLK16 to phase comparators PD2. A control voltage V2 generated by a phase control signal based on phase difference information (UP/DOWN signal) outputted from phase comparators PD2 is supplied via a feedback loop to the phase control circuit, which uses control voltage V2 for the control of the phase of differential clocks CLKa, CLKb.

7 Claims, 8 Drawing Sheets

OVERSAMPLING CLOCK RECOVERY CIRCUIT

BACKGROUND OF THE INVENTION

1. Field of the Invention

The present invention relates to a clock recovery circuit for extracting a clock from inputted data, and more particularly to an oversampling clock recovery circuit for sampling transmitted data with a plurality of clocks that are out of phase with each other.

2. Description of the Related Art

In recent years, there has been proposed a high-speed protocol for the transmission of data. In view of the proposed high-speed protocol, there are demands for high-speed clock recovery circuits for extracting a clock from data transmitted at a high rate, or high-speed phase-locked loops (PLL) for synchronizing the frequency of a clock used within a circuit with the frequency of a clock transmitted to the circuit.

One conventional analog clock recovery circuit uses a single-phase clock whose each positive-going edge is associated with one-bit data for phase comparison. According to the conventional analog clock recovery circuit, since the data rate and the clock frequency need to be equal to each other, if the data rate is at a Gbps level, then it is necessary that the clock frequency be a high frequency at a GHz level. It has been difficult to meet demands for high-speed clock recovery circuits and high-speed phase-locked loops. For example, it is not easy to increase the oscillation frequency of a voltage-controlled oscillator (VCO) included in a phase-locked loop to a high frequency at a GHz level.

In order to meet the above demands, there has been proposed an oversampling clock recovery circuit for sampling transmitted data with a plurality of clocks that are out of phase with each other which have a frequency lower than the rate of data generated within the circuit. The proposed oversampling clock recovery circuit associates a plurality of positive-going edges of the clocks with one-bit data for phase comparison. The oversampling clock recovery circuit can meet the demands for high-speed clock recovery circuits because it uses clocks having a frequency lower than the data rate.

Figure 1A:
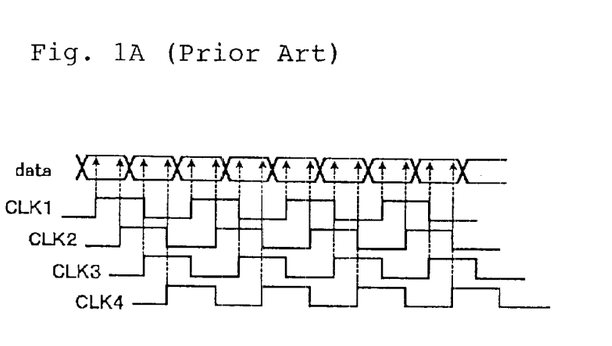
FIGS. 1A and 1B are diagrams of the waveforms of data and clocks, showing oversampling clock recovery processes.
Figure 1B:
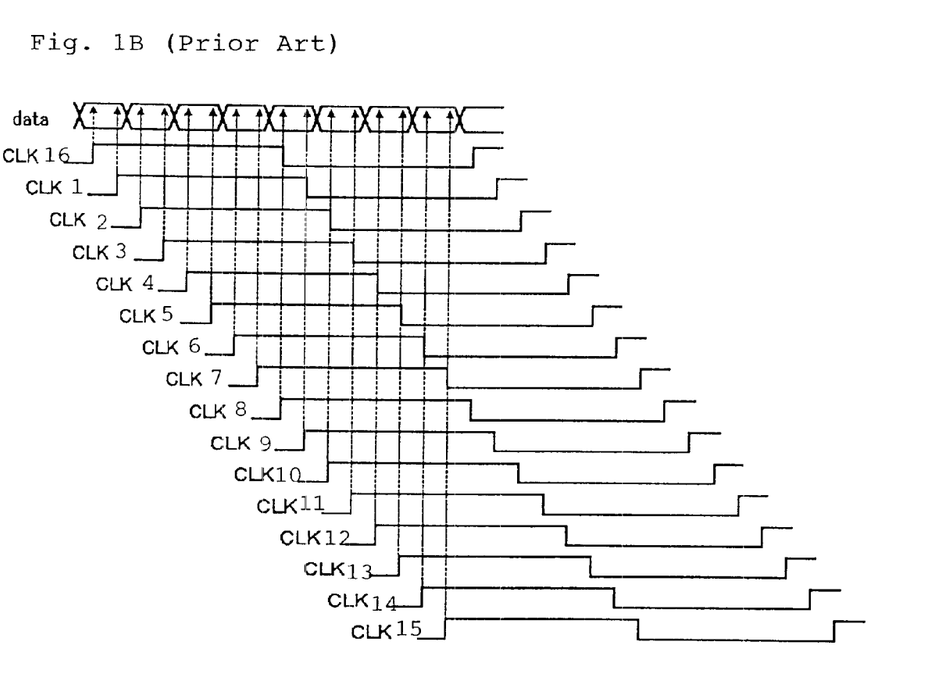

For oversampling data at twice the sampling rate with a clock frequency that is one-half of the data rate, as shown in FIG. 1A of the accompanying drawings, four-phase clocks CLK1 through CLK4 are used. For oversampling data at twice the sampling rate with a clock frequency that is one-eighth of the data rate, as shown in FIG. 1B of the accompanying drawings, 16-phase clocks CLK1 through CLK16 are used.

In the oversampling clock recovery circuit, a voltage-controlled oscillator generates a predetermined number of clocks (hereinafter referred to as "multiphase clocks") required for phase comparison, as disclosed in Japanese laid-open patent publication No. 10-4349 and U.S. Pat. No. 5,694,062.

Figure 2:
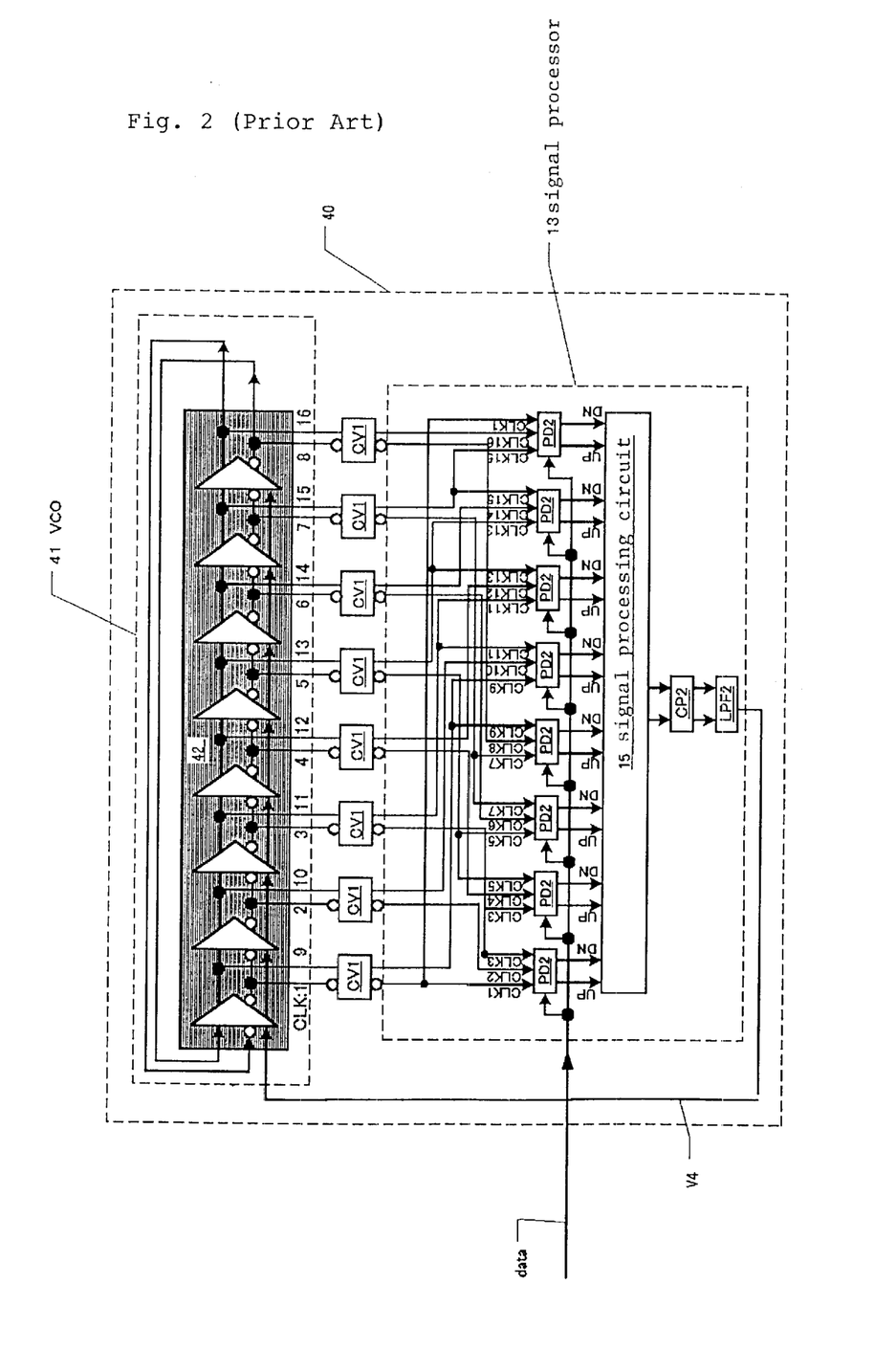
FIG. 2 is a block diagram of a conventional oversampling clock recovery circuit.

An oversampling clock recovery circuit in which multiphase clocks are generated by a voltage-controlled oscillator will be described below with reference to FIG. 2 of the accompanying drawings. FIG. 2 is a block diagram of conventional oversampling clock recovery circuit 40, which performs phase comparison using 16-phase clocks.

In conventional oversampling clock recovery circuit 40, voltage-controlled oscillator 41 includes voltage-controlled delay line 42 comprising a cascaded array of eight differential buffers, and generates 16-phase clocks (differential 8 clock phases) while performing frequency and phase modulation.

Signal processor 13 is supplied with the 16-phase clocks from voltage-controlled oscillator 41 and extracts clocks for an oversampling process. Signal processor 13 has eight phase detectors PD2 each for carrying out phase comparison between successive three-phase clocks of the 16-phase clocks and inputted serial data. If the clocks lag the inputted serial data, then each of phase detectors PD2 outputs an UP signal. If the clocks lead the inputted serial data, then each of phase detectors PD2 outputs a DOWN signal. Based the UP signal or DOWN signal (phase difference information), signal processor 13 generates control voltage V4 suitable for bringing the clocks into phase with the inputted serial data, and applies generated control voltage V4 to voltage-controlled oscillator 41. Thus, voltage-controlled oscillator 41 is feedback-controlled to modulate the frequency and phase of the clocks again based on control voltage V4 in order to bring the clocks into phase with the inputted serial data, thus generating 16-phase clocks that are supplied to signal processor 13. In FIG. 2, control voltage V4 is generated by signal processing circuit 15, charge pump CP2, and low-pass filter LPF2, for example. Signal processing circuit 15 comprises a majority circuit, an averaging circuit, etc.

Converters CV1 converts the multiphase clocks from a differential signal into a single-phase signal and also converts them from a small amplitude to a large amplitude before the multiphase clocks are supplied to signal processor 13.

If clock recovery circuit 40 is supplied with 2.5 Gbps serial data, then clock recovery circuit 40 uses a clock frequency of 312.5 MHz (a period of 3200 ps), and each of the differential buffers of voltage control delay line 42 has a propagation delay time of 200 ps. Therefore, clock recovery circuit 40 generates 16-phase clocks that are successively out of phase by 200 ps.

The conventional clock recovery circuit has suffered the following problems:

In the conventional clock recovery circuit, the voltage-controlled oscillator is controlled to achieve phase synchronization. Therefore, in the process of phase control, the frequency is necessarily caused to fluctuate, making jitter characteristics poor and lowering the quality of the clocks.

The conventional clock recovery circuit also suffers a problem when applied to a transceiver having a number of serial input/output channels.

Figure 3:
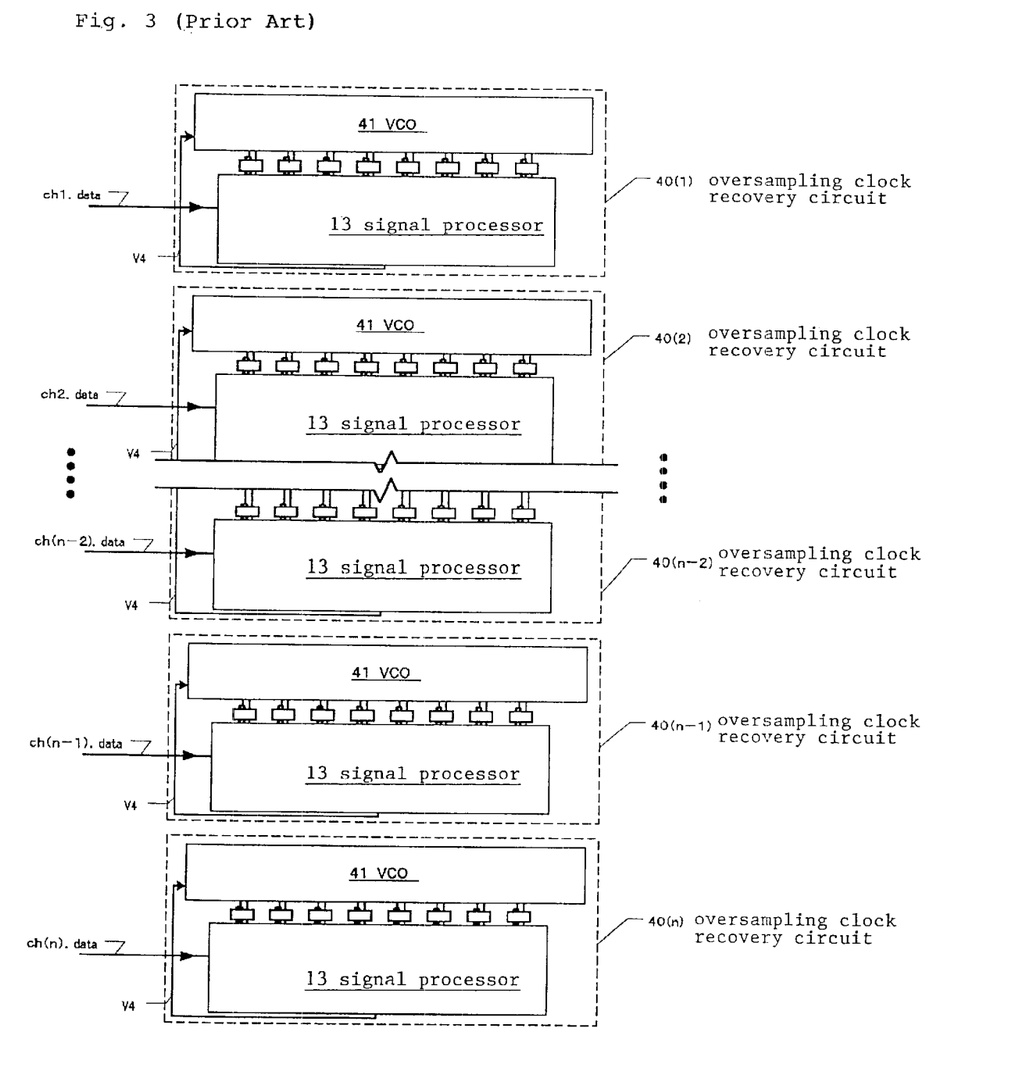
FIG. 3 is a block diagram of an arrangement in which conventional oversampling clock recovery circuits are provided in respective channels.

For example, if conventional clock recovery circuits 40 are provided in respective channels as shown in FIG. 3 of the accompanying drawings, then a number of voltage-controlled oscillators 41 are present on an IC chip. Voltage-controlled oscillators 41 on the IC chip tend to resonate between the channels, making jitter characteristics poor and lowering the quality of the multiphase clocks. Furthermore, since the voltage-controlled oscillators generally have a large power consumption requirement, the overall chip consumes a large amount of electric energy.

If one voltage-controlled oscillator is shared by a number of channels to supply multiphase clocks to the channels, then difficulty arises in supplying the multiphase clocks to the channels. In the process of supplying the multiphase clocks to the channels, the multiphase clocks are degraded to different extents for the different phases, resulting in a reduction in the quality of the multiphase clocks. An arrangement wherein one voltage-controlled oscillator is shared by a number of channels to supply multiphase clocks to the channels will be described below with reference to FIG. 4 of the accompanying drawings.

Figure 4:
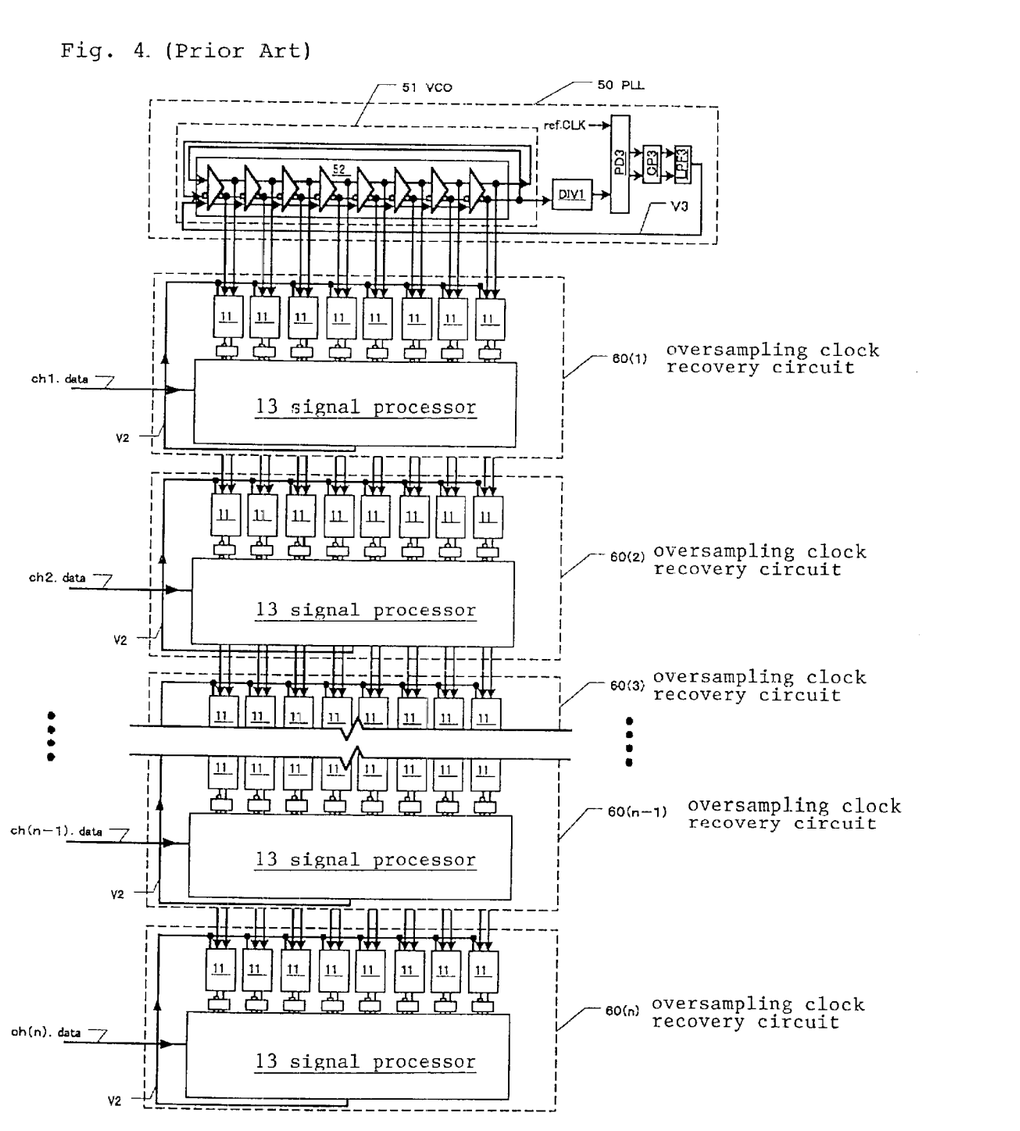
FIG. 4 is a block diagram of an arrangement in which a voltage-controlled oscillator is shared by a number of channels to supply multiphase clocks to the channels.

As shown in FIG. 4, channels ch1 through ch(n) are associated respectively with oversampling clock recovery circuits 60(1) through 60(n) each having signal processor 13 and phase control circuit 11. Single phase-locked loop 50 including voltage-controlled oscillator 51 generates multiphase clocks (16-phase clocks in FIG. 4) and supplies the generated multiphase clocks to respective oversampling clock recovery circuits 60(1) through 60(n). Channels ch1 through ch(n) are not associated with respective voltage-controlled oscillators, but receive the multiphase clocks from phase-locked loop 50 and performs phase control between the multiphase clocks and inputted data.

Since the single voltage-controlled oscillator is shared by the many channels, the system shown in FIG. 4 is free of drawbacks that would be caused if a number of voltage-controlled oscillators were present on one IC chip.

However, since phase-locked loop 50 is required to supply multiphase clocks to many channels ch1 through ch(n), it suffers some difficulty in distributing the clocks. For example, the distribution of the 16-phase clocks to a wide range of circuits is liable to increase electric power consumption needed for buffering. Therefore, the efficiency of clock distribution from phase-locked loop 50 to the channels is poor.

It is highly difficult to distribute the 16-phase clocks to clock recovery circuits 60 of the respective channels while keeping the 16-phase clocks accurately out of phase with each other, i.e., while keeping the phase differences accurately between the 16-phase clocks. Accordingly, the problem of the reduced quality of the multiphase clocks cannot be solved.

Furthermore, as shown in FIG. 4, each of clock recovery circuits 60 of respective channels ch1 through ch(n) needs phase control circuits 11 for performing phase comparison between the multiphase clocks and the inputted data and subsequently phase synchronization between the inputted data and the clocks. If the 16-phase clocks are received and synchronized in phase with the inputted data, as shown in FIG. 4, each of channels ch1 through ch(n) requires eight phase control circuits 11. Inasmuch as phase control circuits 11 are highly critical in their functions and generally need a large circuit scale and a large amount of electric power to be consumed, it is not preferable to provide 8 functionally identical phase control circuits per channel.

SUMMARY OF THE INVENTION

It is therefore an object of the present invention to provide an oversampling clock recovery circuit which has a plurality of phase comparators for sampling inputted data with a plurality of clocks out of phase with each other for phase comparison, for controlling the phase of the clocks based on phase difference information output from the phase comparators, the oversampling clock recovery circuit being capable of preventing jitter characteristics thereof from being lowered and of generating high-quality clocks.

Another object of the present invention is to provide an oversampling clock recovery circuit which is capable of generating high-quality clocks when applied to a transceiver having a number of serial input/output channels.

Still another object of the present invention is to provide an oversampling clock recovery circuit which has a high circuit area efficiency, a high electric power efficiency, and a high clock distribution efficiency when applied to multiple channels.

To achieve the above objects, there is provided in accordance with a first aspect of the present invention an oversampling clock recovery circuit having a plurality of phase comparators for sampling inputted data with a number of clocks which are out of phase with each other for phase comparison, for controlling the phase of the clocks based on phase difference information output from the phase comparators, comprising a phase control circuit for being supplied with a fewer clocks than the number of clocks and controlling the phase of the supplied clocks, and a delay-locked loop for generating the number of clocks based on the fewer clocks controlled in phase by the phase control circuit, and supplying the generated number of clocks to the phase comparators, the arrangement being such that a phase control signal based on the phase difference information output from the phase comparators is supplied via a feedback loop to the phase control circuit.

With an oversampling clock recovery circuit according to the first aspect, a relatively small number of clocks are supplied, and controlled in phase by a phase control circuit. From the phase-controlled clocks, a delay-locked loop (DLL) generates a relatively large number of clocks (multiphase clocks) required for phase comparison, and supplies generated clocks to the phase comparators for phase comparison.

The oversampling clock recovery circuit according to the first aspect offers the following advantages:

First, since no voltage-controlled oscillator is required in each channel, jitter characteristics are not degraded by frequency fluctuations.

Secondly, even though the oversampling clock recovery circuit is provided in each channel, no voltage-controlled oscillator is included in each channel, and hence there is no possibility of undue interference such as clock resonance between the channels.

Thirdly, even though oversampling clock recovery circuit 10 is provided in each channel, it is not necessary to distribute multiphase clocks to each channel, but a relatively small number of clocks may be distributed to each channel. Therefore, no unduly large increase in the consumption of electric power is needed for the distribution of multiphase clocks.

According to the fourth advantage, even though the oversampling clock recovery circuit is provided in each channel, it is not necessary to distribute multiphase clocks to each channel, but a relatively small number of clocks may be distributed to each channel. Therefore, the system is free of a reduction in the quality of multiphase clocks when the clocks are distributed, due to variations or skews of phase intervals between the multiphase clocks.

The fifth advantage is that since the phase is controlled with respect to a relatively small number of clocks. Therefore, the circuit scale and the power consumption can be made smaller than the conventional arrangement which controls the phase of multiphase clocks.

The sixth advantage is that because a relatively small number of clocks which have been controlled highly accurately in phase by the phase control circuit are developed into multiphase clocks by the delay-locked loop immediately prior to phase comparison, it is possible to supply the phase comparators with extremely high-quality multiphase clocks that are kept out of phase accurately.

According to the seventh advantage, since only one phase control circuit is used that is required to operate highly critically, the recovery process is made much more reliable than the conventional arrangement which comprises a plurality of parallel phase control circuits.

According to a second aspect of the present invention, in the oversampling clock recovery circuit according to the first aspect, the fewer clocks comprise one or two clocks.

According to a third aspect of the present invention, in the oversampling clock recovery circuit according to the first aspect, the fewer clocks comprise one clock.

With the oversampling clock recovery circuit according to the third aspect, a single-phase clock is supplied, and controlled in phase by a phase control circuit. From the single-phase clock, a delay-locked loop generates a relatively large number of clocks (multiphase clocks) required for phase comparison, and supplies generated clocks to the phase comparators for phase comparison.

Since a voltage-controlled oscillator (VCO) or a phase-locked loop (PLL) is a source for supplying clocks of an accurate frequency, they should preferably be of a differential arrangement having good jitter characteristics.

In the oversampling clock recovery circuit according to the third aspect, since the phase control circuit and the delay-locked loop are of a single-phase arrangement, the oversampling clock recovery circuit has a low power requirement while its jitter characteristics are not degraded The above and other objects, features, and advantages of the present invention will become apparent from the following description with reference to the accompanying drawings which illustrate examples of the present invention.

DETAILED DESCRIPTION OF THE PREFERRED EMBODIMENTS

Oversampling clock recovery circuits according to embodiments the present invention will be described below with reference to the drawings. The oversampling clock recovery circuits described below are illustrated by way of example only and should not be interpreted as being limitative of the present invention.

In the present invention, it is assumed that oversampling clock recovery circuits oversample serially inputted data having a data rate of 2.5 Gbps at twice the sampling rate with a clock frequency of 312.5 MHz that is one-eighth of the data rate. Such an oversampling process requires 16-phase clocks CLK1 through CLK16 for extracting clocks, as shown in FIG. 1B.

Figure 5:
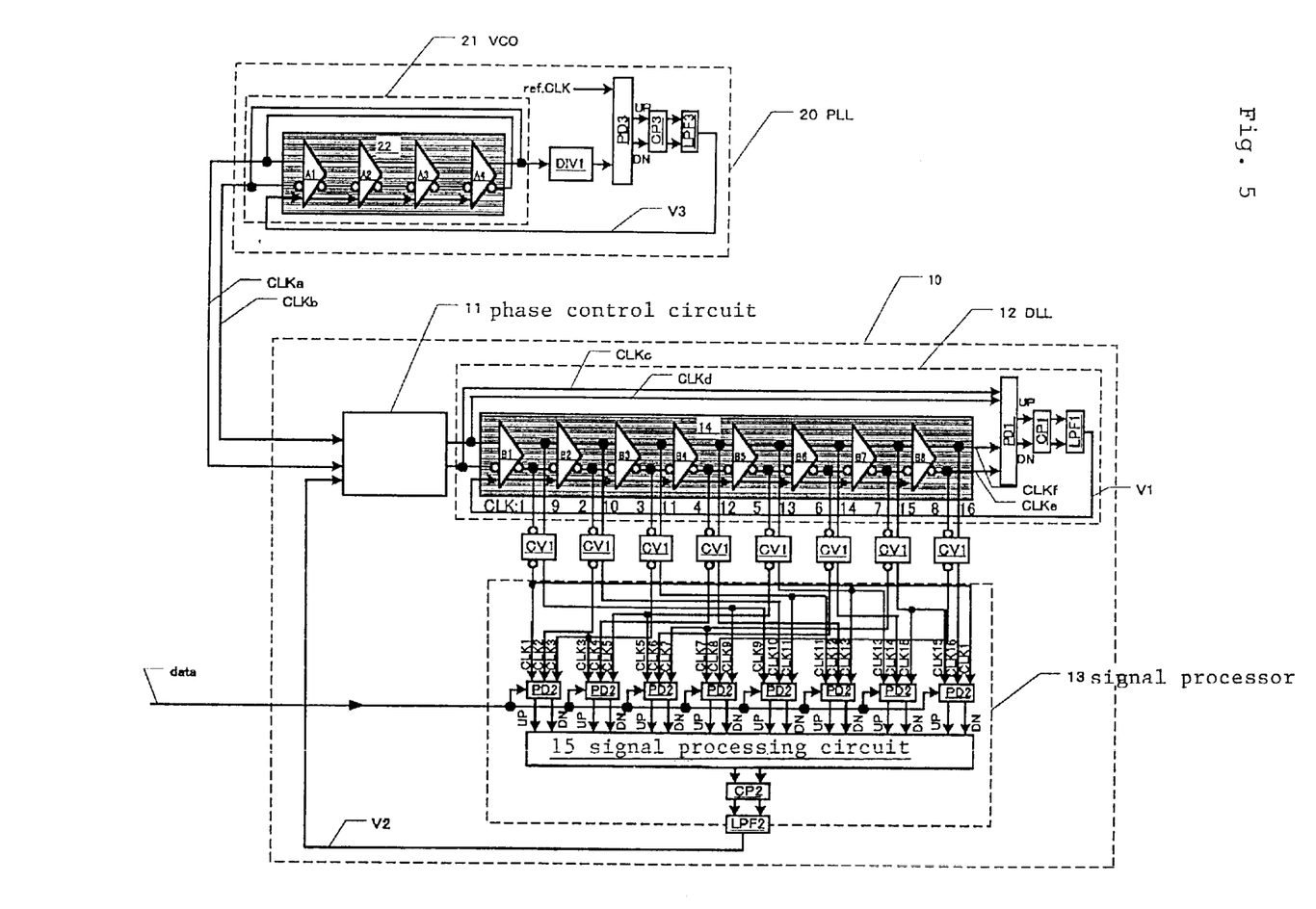
FIG. 5 is a block diagram of an oversampling clock recovery circuit according to an embodiment of the present invention.

FIG. 5 shows in block form oversampling clock recovery circuit 10 according to an embodiment of the present invention. As shown in FIG. 5, oversampling clock recovery circuit 10 has eight phase comparators PD2 for sampling inputted data with 16-phase clocks CLK1 through CLK16 that are out of phase with each other for phase comparison, and controls the phase of clocks CLK1 through CLK16 based on phase difference information (UP, DOWN signals) that is outputted from phase comparators PD2.

Oversampling clock recovery circuit 10 does not directly control the phase of clocks CLK1 through CLK16, but is supplied with two-phase clocks CLKa, CLKb fewer than 16-phase clocks CLK1 through CLK16 and controls the phase of two-phase clocks CLKa, CLKb with phase control circuit 11. Two-phase clocks CLKa, CLKb each have a frequency of 312.5 MHz and serve as a differential pair out of phase with each other by 1600 ps corresponding to one-half of the period.

Delay-locked loop (DLL) 12 generates 16-phase clocks CLK1 through CLK16 from differential clocks outputted from phase control circuit 11, and supplies generated 16-phase clocks CLK1 through CLK16 to phase comparators PD2.

Control voltage V2 is generated by a phase control signal based on the phase difference information (UP, DOWN signals) that is outputted from phase comparators PD2, and applied via a feedback loop to phase control circuit 11. Phase control circuit 11 uses control voltage V2 for controlling the phase of differential clocks CLKa, CLKb.

In the present embodiment, differential clocks CLKa, CLKb are generated and supplied by phase-locked loop (PLL) 20. Phase-locked loop 20 comprises voltage-controlled oscillator 21, frequency multiplier DIV1 connected to voltage-controlled oscillator 21, phase comparator PD3, charge pump CP3, and low-pass filter LPF3. Voltage-controlled oscillator 21 includes voltage-controlled delay line 22 comprising a cascaded array of our differential buffers A1 through A4.

In phase-locked loop 20, phase comparator PD3 receives a clock whose frequency has been multiplied by frequency multiplier DIV1 and reference clock ref.CLK, compares the received clocks for phase, and outputs an UP/DOWN signal to charge pump CP3. Charge pump CP3 and low-pass filter LPF3 generate control voltage V3, which is applied via a feedback loop to differential buffers A1 through A4 to enable voltage-controlled oscillator 21 to generate a clock having a frequency of 312.5 MHz and a period of 3200 ps. Differential clocks CLKa, CLKb are extracted from voltage-controlled oscillator 21 and supplied to phase control circuit 11 in oversampling clock recovery circuit 10. Since phase-locked loop 20 is used, the clock having a stable frequency can be supplied to phase control circuit 11.

Phase control circuit 11 may be of a digital control type or an analog control type. In the present embodiment, phase control circuit 11 is basically illustrated as a phase control circuit of the analog control type, and occasionally illustrated as a phase control circuit of the digital control type when necessary. Phase control circuit 11 is supplied with differential clocks CLKa, CLKb and also supplied with control voltage V2 from signal processor 13. Based on control voltage V2, phase control circuit 11 controls, e.g., advances or delays, the phase of differential clocks CLKa, CLKb. Differential clocks (hereinafter referred to as "differential clocks CLKc, CLKd") which have been controlled in phase by phase control circuit 11 are outputted to delay-locked loop 12.

Delay-locked loop 12 comprises voltage-controlled delay line 14 in the form of a cascaded array of eight differential buffers B1 through B8, phase comparator PD1 connected to voltage-controlled delay line 14, charge pump CP1, and low-pass filter LPF1.

Differential clocks CLKc, CLKd are applied to first-stage differential buffer B1 and phase comparator PD1. Eighth-stage differential buffer B8 outputs differential clocks (hereinafter referred to as "differential clocks CLKe, CLKf" which are assumed to result from respective differential clocks CLKc, CLKd) having an overall delay caused by all buffers B1 through B8 after having passed through voltage-controlled delay line 14. Differential clocks CLKe, CLKf are applied to phase comparators PD1. Phase comparator PD1 compares clocks CLKc, CLKf and clocks CLKd, CLKe for phase to detect a phase error.

If the phase of clock CLKf (CLKe) lags the phase of clock CLKc (CLKd), then phase comparator PD1 outputs an UP signal to charge pump CP1. If the phase of clock CLKf (CLKe) leads the phase of clock CLKc (CLKd), then phase comparator PD1 outputs a DOWN signal to charge pump CP1.

Charge pump CP1 and low-pass filter LPF1 generate control voltage V1 based on the phase difference information from phase comparator PD1, and applies generated control voltage V1 to differential buffers B1 through B8.

When delay-locked loop 12 is finally synchronized, positive-going edges of clock CLKf (CLKe) having passed through and delayed by voltage-controlled delay line 14 and negative-going edges of clock CLKc (CLKd) before passing through voltage-controlled delay line 14 are in synchronism with each other. As a result, voltage-controlled delay line 14 has a total delay time of 1600 ps which corresponds to one-half of the period of the clock whose frequency is 312.5 MHz. If the buffers of the delay line have identical characteristics and are supplied with identical control voltages, then the propagation delay time of each of the buffers has a value that is produced by dividing the total delay time of the delay line by the number of buffers of the delay line. In the present embodiment, differential buffers B1 through B8 of voltage-controlled delay line 14 have identical characteristics and are supplied with the same control voltage V1, the propagation delay time of each of differential buffers B1 through B8 is 200 ps which is produced by diving the total delay time of 1600 ps by the number of those buffers, i.e., 8. The delay time of voltage-controlled delay line 14 is controlled so as to be constant by a feedback control process carried out by delay-locked loop 12.

As described above, the delay times of eight differential buffers B1 through B8 of voltage-controlled delay line 14 are kept constant. That is, the delay times of eight differential buffers B1 through B8 are controlled to keep 16-phase clocks CLK1 through CLK16 out of phase by 1600 ps/8= 200 ps at all times.

Eight differential buffers B1 through B8 of voltage-controlled delay line 14 output respective eight pairs of differential clocks that are out of phase by 200 ps. These outputted differential clocks are converted by converters CV1 from differential signals into single-phase signals and also from small amplitudes to large amplitudes, and then outputted to phase comparators PD2. Thus, delay-locked loop 12 serves to generate multiphase clocks CLK1 through CLK16, and signal processor 13 receives generated multiphase clocks CLK1 through CLK16. Delay-locked loop 12 generates multiphase clocks CLK1 through CLK16 that are kept out of phase highly accurately, which are supplied to signal processor 13.

Signal processor 13 uses the supplied multiphase clocks to extract clocks for an oversampling process. Each of eight phase comparators PD2 of signal processor 13 compares successive three-phase clocks, which are 200 ps out of phase with each other, of the 16-phase clocks, with inputted serial data of 2.5 Gbps for phase. If the clocks lag the inputted data, then each of phase comparators PD2 outputs an UP signal. If the clocks lead the inputted data, then each of phase comparators PD2 outputs a DOWN signal.

Based on the UP or DOWN signal (phase difference information), signal processor 13 generates control voltage V2 and supplies generated control voltage V2 to phase control circuit 11, which is of the analog control type, in order to synchronize the clocks with the inputted data in phase.

In response to control voltage V2 from signal processor 13, phase control circuit 11 controls, e.g., advances or delays, the phase of differential clocks CLKa, CLKb according to control voltage V2. Differential clocks CLKc, CLKd which have been controlled in phase by phase control circuit 11 are outputted to delay-locked loop 12.

Oversampling clock recovery circuit 10 repeats the above operation to keep 16-phase clocks CLK1 through CLK16 supplied to signal processor 13 accurately out of phase and synchronize 16-phase clocks CLK1 through CLK16 with the inputted data.

Figure 8:
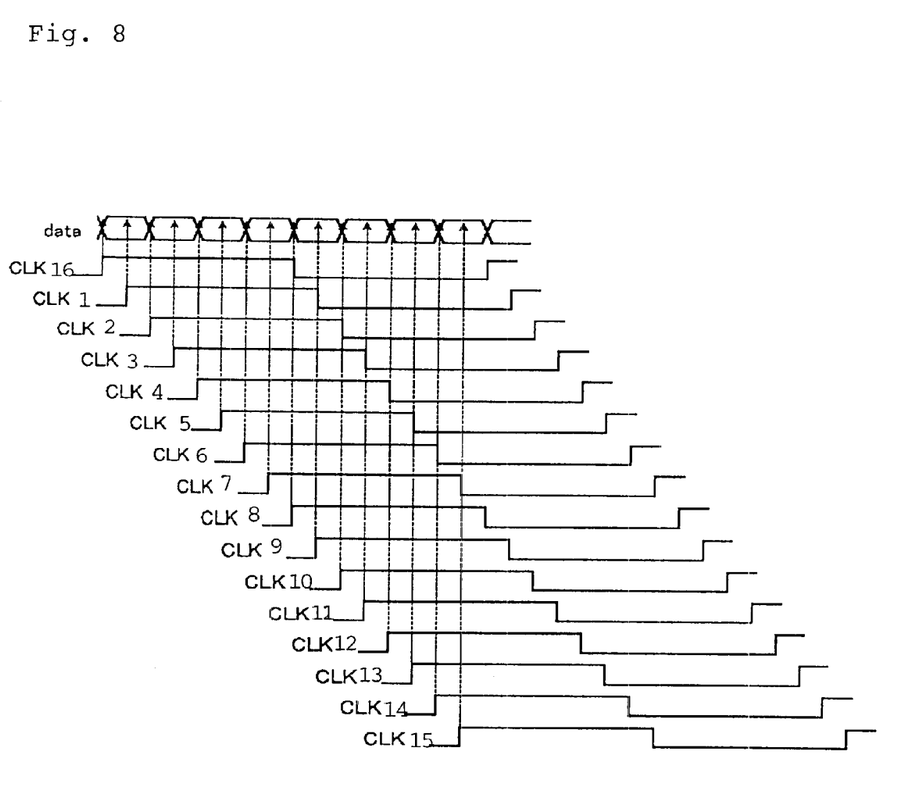
FIG. 8 is a:diagram of the waveforms of data and clocks synchronized in phase with each other, showing an oversampling clock recovery process.

FIG. 8 shows the waveforms of the data and the clocks that are held in synchronism with each other. Even if the clocks lag the data as shown in FIG. 1B, when oversampling clock recovery circuit 10 operates in the manner described above, even-numbered clocks CLK2, CLK4, . . . are held in synchronism with edges of the data bits, whereas odd-numbered clocks CLK1, CLK3, . . . are held in synchronism with centers of the data bits, as shown in FIG. 8.

Oversampling clock recovery circuit 10 is capable of allowing 16-phase clocks CLK1 through CLK16 to follow the data as they fluctuate in phase in order to cause odd-numbered clocks CLK1, CLK3, . . . to sample the inputted data in their reliably open regions, i.e., regions where the values of the inputted data are stably determined.

The processing of signal processor 13 can be performed by any of various conventional arrangements. One arrangement of signal processor 13 will be described below.

A specific arrangement of signal processor 13 for generating control voltage V4 based on the UP/DOWN signal outputted from phase comparators PD2 comprises signal processing circuit 15, charge pump CP2, and low-pass filter LPF2. Signal processing circuit 15 comprises a majority circuit and an averaging circuit.

Each of eight phase comparators PD2 uses successive three-phase clocks, which are 200 ps out of phase with each other, of the 16-phase clocks, and compares the inputted data with the multiphase clocks. For example, eight sets of three clocks CLK1, CLK2, CLK3, three clocks CLK3, CLK4, CLK5, three clocks CLK5, CLK6, CLK7, three clocks CLK7, CLK8, CLK9, three clocks CLK9, CLK10, CLK11, three clocks CLK11, CLK12, CLK13, three clocks CLK13, CLK14, CLK15, and three clocks CLK15, CLK16, CLK1 are used by respective eight phase comparators PD2.

As shown in FIG. 1B or 8, 16-phase clocks that are successively out of phase by 200 ps are denoted by CLK1, CLK2, CLK3, . . . , CLK16. Since delay-locked loop 12 shown in FIG. 5 is of a differential structure, differential buffers B1 through B8 thereof output differential clocks CLK1, CLK9, differential clocks CLK2, CLK10, differential clocks CLK3, CLK11, differential clocks CLK4, CLK12, differential clocks CLK5, CLK13, differential clocks LCK6, CLK14, differential clocks CLK7, CLK15, differential clocks CLK8, CLK16, respectively. The interconnections of oversampling clock recovery circuit are arranged as shown in FIG. 5 such that after the above differential clocks have passed through converters CV1, sets of successive three clocks CLK1, CLK2, CLK3, successive three clocks CLK3, CLK4, CLK5, successive three clocks CLK5, CLK6, CLK7, successive three clocks CLK7, CLK8, CLK9, successive three clocks CLK9, CLK10, CLK11, successive three clocks CLK11, CLK12, CLK13, successive three clocks CLK13, CLK14, CLK15, and successive three clocks CLK15, CLK16, CLK1 are inputted respectively to phase comparators PD2 in the order from the left.

Phase comparators PD2 that are supplied with the respective sets of successive three clocks compare the clocks with the inputted data. If the clocks lag the inputted data, then phase comparators PD2 output an UP signal to signal processing circuit 15. If the clocks lead the inputted data, then phase comparators PD2 output a DOWN signal to signal processing circuit 15. Each time signal processing circuit 15 receives UP/DOWN signals from phase comparators PD2, the majority circuit in signal processing circuit 5 determines a majority of output signals from phase comparators PD2, and determines the phase difference between the data and the clocks at that moment.

The averaging circuit in signal processing circuit 5 averages several UP/DOWN signals that have been determined as a majority. The averaged UP/DOWN signal is outputted to charge pump CP2, charging or discharging charge pump CP2. With the UP/DOWN signals thus averaged, high-frequency data fluctuations caused when UP/DOWN signals are frequently changed and outputted are ignored, i.e., charge pumps CP2 is not charged or discharged, and low-frequency data fluctuations caused when either UP or DOWN signals are successively produced as a majority are processed, i.e., charge pumps CP2 is charged or discharged. Thus, the averaging circuit in signal processing circuit 5 serves as a filter for blocking high-frequency components and passing low-frequency components.

Charges charged in and discharged from charge pump CP2 are passed through low-pass filter LPF2, which produces analog control voltage V2 and output analog control voltage V2 to phase control circuit 11 of the analog control type. If phase control circuit 11 is of the digital control type, then a phase control signal is outputted directly to phase control circuit 11 without passing through low-pass filter LPF2.

The processing of signal processor 13 has been described above by way of illustrative example only, and may be carried out by any of various other circuit arrangement.

Oversampling clock recovery circuit 10 according to the above embodiment as it is applied to a transceiver having a number of serial input/output channels will be described below with reference to FIG. 6.

Figure 6:
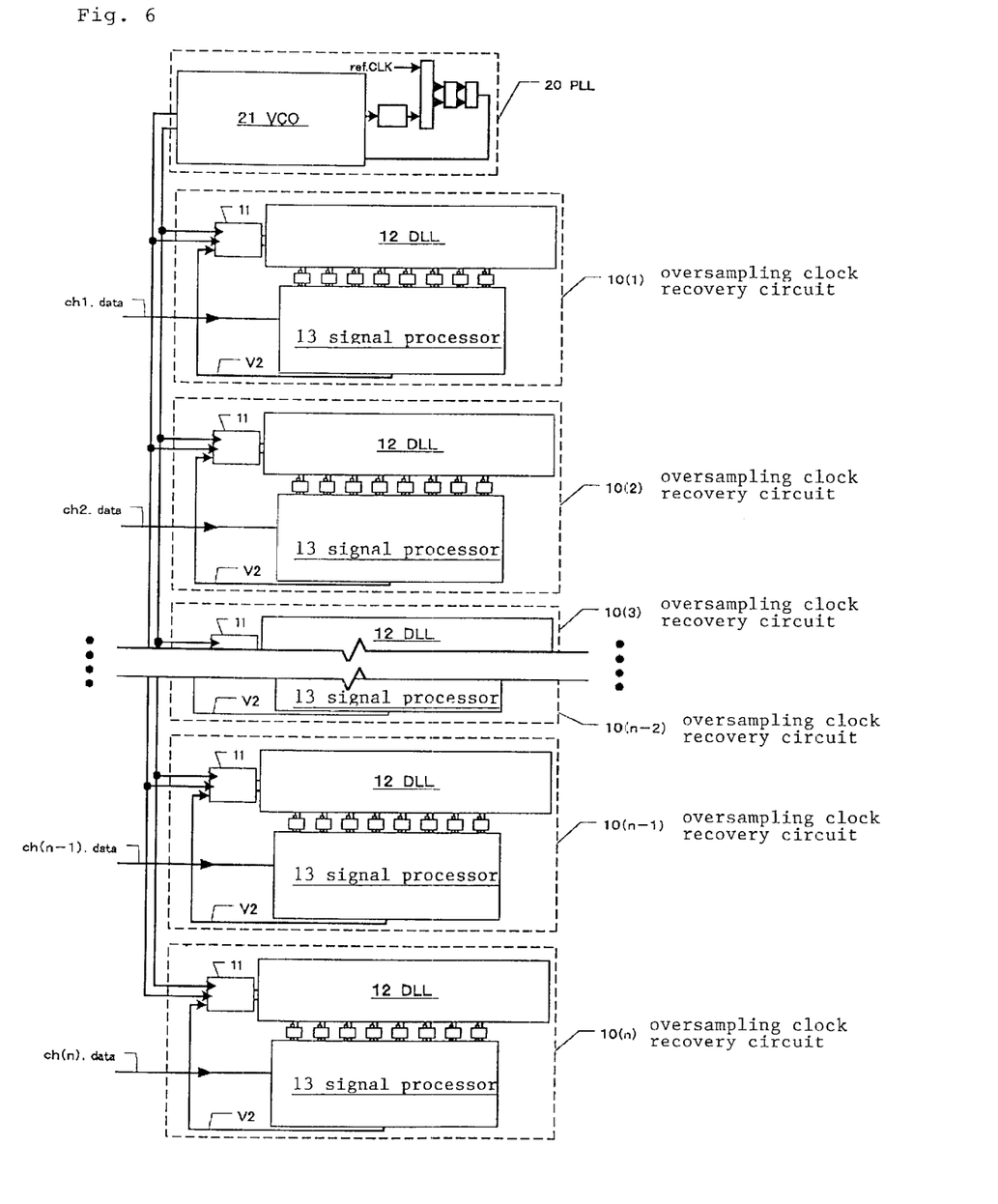
FIG. 6 is a block diagram of an arrangement in which oversampling clock recovery circuits according to the present invention are provided in respective channels.

As shown in FIG. 6, oversampling clock recovery circuits 10 are provided in respective channels ch1 through ch(n). Single phase-locked loop 20 generates differential clocks and distribute the generated differential Clocks to oversampling clock recovery circuits 10(1) through 10(n).

When the oversampling clock recovery circuit 10 in each channel operates in the manner described above, it can produce multiphase clocks having the same frequency as the distributed differential clocks.

The oversampling clock recovery circuit that is used in a multichannel application offers the following advantages:

First, since no voltage-controlled oscillator is required in each channel, jitter characteristics are not degraded by frequency fluctuations.

Secondly, even though oversampling clock recovery circuit 10 is provided in each channel, no voltage-controlled oscillator is included in each channel, and hence there is no possibility of undue interference such as clock resonance between the channels.

Thirdly, even though oversampling clock recovery circuit 10 is provided in each channel, it is not necessary to distribute multiphase clocks to each channel, but a relatively small number of clocks may be distributed to each channel. Therefore, no unduly large increase in the consumption of electric power is needed for the distribution of multiphase clocks.

According to the fourth advantage, even though oversampling clock recovery circuit 10 is provided in each channel, it is not necessary to distribute multiphase clocks to each channel, but a relatively small number of clocks may be distributed to each channel. Therefore, the system is free of a reduction in the quality of multiphase clocks when the clocks are distributed, due to variations or skews of phase intervals between the multiphase clocks.

The fifth advantage is that since the phase is controlled with respect to a relatively small number of clocks. Therefore, the circuit scale and the power consumption can be made smaller than the conventional arrangement (conventional clock recovery circuit 60) which controls the phase of multiphase clocks.

The sixth advantage is that because a relatively small number of clocks which have been controlled highly accurately in phase by phase control circuit 11 are developed into multiphase clocks by the delay-locked loop immediately prior to phase comparison, it is possible to supply phase comparators PD2 with extremely high-quality multiphase clocks that are kept out of phase accurately.

According to the seventh advantage, since only there is used only one phase control circuit 11 that is required to operate highly critically, the recovery process is made much more reliable than the conventional arrangement (conventional clock recovery circuit 60) which comprises a plurality of parallel phase control circuits.

Oversampling clock recovery circuit 30 according to another embodiment of the present invention will be described below with reference to FIG. 7.

Figure 7:
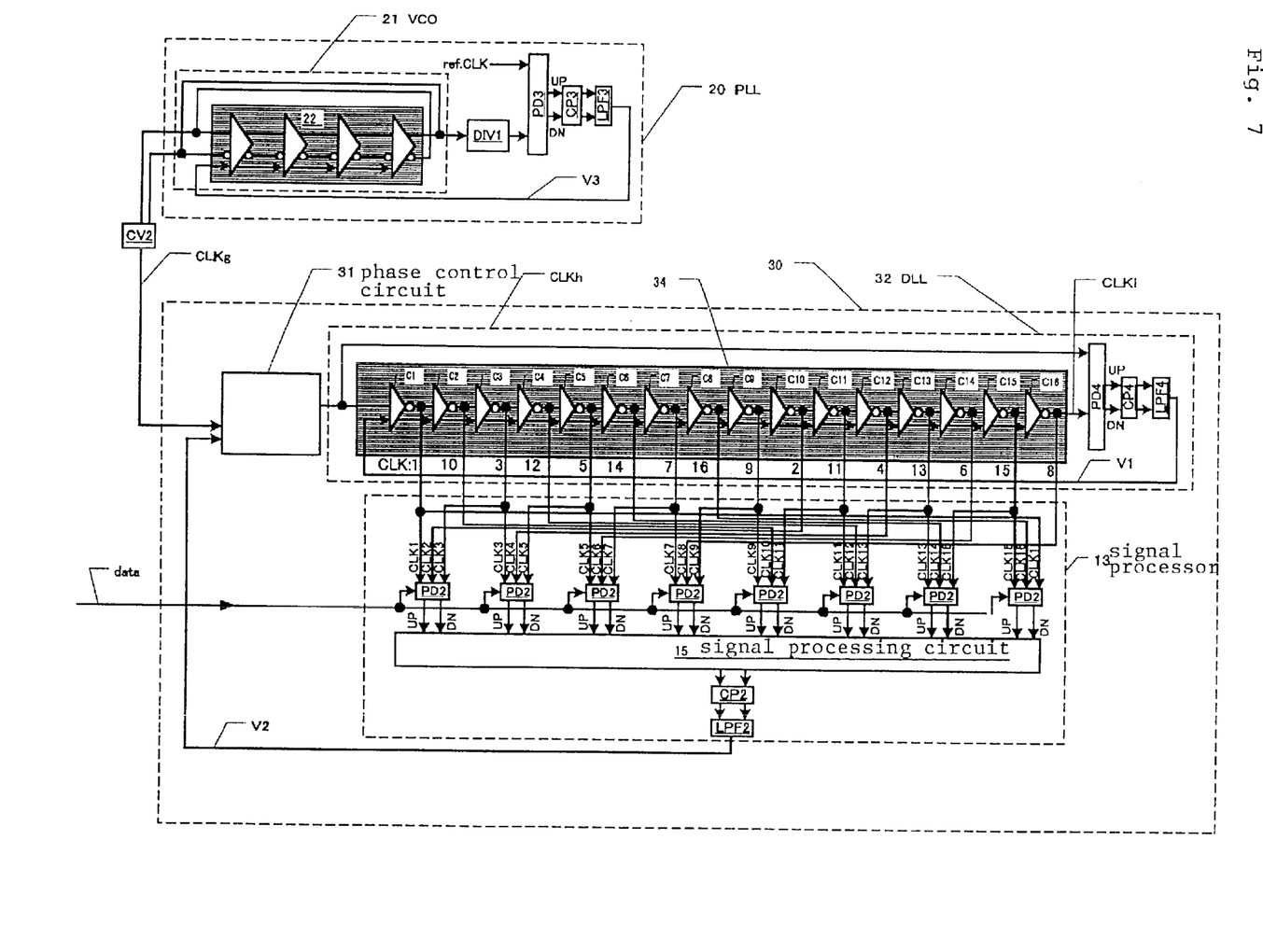
FIG. 7 is a block diagram of an oversampling clock recovery circuit according to another embodiment of the present invention.

As shown in FIG. 7, oversampling clock recovery circuit 30 is similar to oversampling clock recovery circuit 10 in that it receives a clock from phase-locked loop 20, but differs therefrom in that it receives a single-phase click CLKg.

Furthermore, oversampling clock recovery circuit 30 is similar to oversampling clock recovery circuit 10 in that it has signal processor 13, but differs therefrom in that it has phase control circuit 31 and delay-locked loop 32 which are of a single-phase arrangement. Delay-locked loop 32 comprises voltage-controlled delay line 34 in the form of a cascaded array of 16 single-phase buffers C1 through C16, phase comparator PD4 connected to voltage-controlled delay line 34, charge pump CP4, and low-pass filter LPF4.

Differential clocks produced by delay-locked loop are converted by converter CV2 from differential signals into a single-phase signal and also from a small amplitude into a large amplitude. As a result, converter CV2 outputs single-phase clock CLKg, which is inputted to phase control circuit 31.

Thereafter, clock CLKg is controlled in phase by phase control circuit 31. The clock (hereinafter referred to as "clock CLKh") which has been controlled in phase by phase control circuit 31 is applied to first-stage differential buffer C1 and phase comparator PD4. 16th-stage differential buffer C16 outputs a clock (hereinafter referred to as "clock CLKi") having an overall delay caused by all buffers C1 through C16 after having passed through voltage-controlled delay line 34. Clock CLKi is applied to phase comparator PD4. Phase comparator PD4 compares clocks CLKh, CLKi for phase to detect a phase error.

If the phase of clock CLKi lags the phase of clock CLKh, then phase comparator PD4 outputs an UP signal to charge pump CP4. If the phase of clock CLKi leads the phase of clock CLKh, then phase comparator PD4 outputs a DOWN signal to charge pump CP4.

Charge pump CP4 and low-pass filter LPF4 generate control voltage V1 based on the phase difference information from phase comparator PD4, and applies generated control voltage V1 to buffers C1 through C16.

When delay-locked loop 32 is finally synchronized, positive-going edges of clock CLKi having passed through and delayed by voltage-controlled delay line 34 and negative-going edges of clock CLKh before passing through voltage-controlled delay line 34 are in synchronism with each other. As a result, voltage-controlled delay line 34 has a total delay time of 3200 ps which corresponds to one period of the clock whose frequency is 312.5 MHz. If the buffers of the delay line have identical characteristics and are supplied with identical control voltages, then the propagation delay time of each of the buffers has a value that is produced by dividing the total delay time of the delay line by the number of buffers of the delay line. In the present embodiment, buffers C1 through C16 of voltage-controlled delay line 34 have identical characteristics and are supplied with the same control voltage V1, the propagation delay time of each of buffers C1 through C16 is 200 ps which is produced by diving the total delay time of 3200 ps by the number of those buffers, i.e., 16. The delay time of voltage-controlled delay line 34 is controlled so as to be constant by a feedback control process carried out by delay-locked loop 32.

As described above, the delay times of 16 buffers C1 through C16 of voltage-controlled delay line 34 are kept constant. That is, the delay times of 16 buffers C1 through C16 are controlled to keep 16-phase clocks CLK1 through CLK16 out of phase by 3200 ps/16=200 ps at all times.

16 buffers C1 through C16 of voltage-controlled delay line 34 output respective 16 clocks that are out of phase by 200 ps. Sets of successive three clocks are outputted respectively to phase comparators PD2.

As shown in FIG. 1B or 8, 16-phase clocks that are successively out of phase by 200 ps are denoted by CLK1, CLK2, CLK3, . . . , CLK16. Since delay-locked loop 32 shown in FIG. 7 use inverters as buffers C1 through C16, buffers C1 through C16 output clocks CLK1, CLK10, CLK3, CLK12, CLK5, CLK14, CLK7, CLK16, CLK9, CLK2, CLK11, CLk4, CLK13, CLK6, CLK15, CLK8, respectively. The interconnections of oversampling clock recovery circuit are arranged as shown in FIG. 7 such that sets of successive three clocks CLK1, CLK2, CLK3, successive three clocks CLK3, CLK4, CLK5, successive three clocks CLK5, CLK6, CLK7, successive three clocks CLK7, CLK8, CLK9, successive three clocks CLK9, CLK10, CLK11, successive three clocks CLK11, CLK12, CLK13, successive three clocks CLK13, CLK14, CLK15, and successive three clocks CLK15, CLK16, CLK1 are inputted respectively to phase comparators PD2 in the order from the left.

After the sets of successive three clocks are inputted to phase comparators PD2, oversampling clock recovery circuit 30 repeatedly operates in the same manner as oversampling clock recovery circuit 10 to keep 16-phase clocks CLK1 through CLK16 supplied to signal processor 13 out of phase accurately and synchronize 16-phase clocks CLK1 through CLK16 with the inputted data in phase.

Since oversampling clock recovery circuit 30 according to the present embodiment has phase control circuit 31 and delay-locked loop 32 which are of a single-phase arrangement, it can use large-amplitude CMOS logic components, and hence has a lower power requirement than oversampling clock recovery circuits 10, 40, 60. Conventional oversampling clock recovery circuit 40 with a voltage-controlled oscillator tends to have its jitter characteristics degraded if voltage-controlled oscillator 41 is of a single-phase arrangement. In oversampling clock recovery circuit 30 according to the present embodiment, however, phase control circuit 31 and delay-locked loop 32 are of a single-phase arrangement.

Therefore, oversampling clock recovery circuit 30 according to the present embodiment is free of the above tendency of conventional oversampling clock recovery circuit 40. Consequently, oversampling clock recovery circuit 30 has a low power requirement though its jitter characteristics remain in a desired good level.

As with oversampling clock recovery circuit 10, oversampling clock recovery circuit 30 according to the present embodiment is well applicable to a transceiver having a number of serial input/output channels, and offers the same advantages.

According to the present invention, as described above, an oversampling clock recovery circuit does not use a voltage-controlled oscillator, but has a phase control circuit and an analog delay-locked loop. The oversampling clock recovery circuit is supplied with a relatively small number of clocks from a phase control circuit, controls the phase of the relatively small number of clocks, develops the phase-controlled clocks into a number of clocks in as many phases as required for phase comparison, and supplies the clocks to phase comparators. According to the present invention, therefore, the oversampling clock recovery circuit has its jitter characteristics improved and is capable of generating high-quality clocks.

If the oversampling clock recovery circuit is applied to a transceiver having a number of serial input/output channels, then it can produce high-quality clocks as it is free any possibility of undue interference such as clock resonance between the channels.

If the oversampling clock recovery circuit is applied to multiple channels, then it has a high circuit area efficiency, a high electric power efficiency, and a high clock distribution efficiency.

While preferred embodiments of the present invention have been described using specific terms, such description is for illustrative purposes only, and it is to be understood that changes and variations may be made without departing from the spirit or scope of the following claims.

What is claimed is:

1. An oversampling clock recovery circuit having a plurality of phase comparators sampling for phase comparison an inputted data signal with a number of generated clocks which are out of phase with each other, said plurality of phase comparators providing phase difference information to control the phase of the generated clocks, said oversampling clock recovery circuit comprising:

a phase control circuit supplied with fewer clocks than said number of generated clocks for controlling the phase of the generated clocks; and a delay-locked loop for generating said number of generated clocks based on said fewer clocks controlled for phase by said phase control circuit, and supplying the generated number of clocks to said phase comparators, wherein a phase control signal based on the phase difference information output from the phase comparators is supplied via a feedback loop to said phase control circuit.

2. The oversampling clock recovery circuit according to claim 1, wherein said fewer clocks comprise one or two clocks.

3. The oversampling clock recovery circuit according to claim 1, wherein said fewer clocks comprise one clock.

4. An oversampling clock recovery circuit, comprising:

a delay-locked loop generating a plurality of clock signals;

a plurality of phase detectors corresponding in number to said plurality of clock signals, each said phase detector receiving a predetermined one of said plurality of clock signals to compare with an input data signal; and a phase control circuit receiving, as a first input, at least one signal from said plurality of phase detectors via a feedback loop comprising said delay-locked loop and said plurality of phase detectors and, as a second input, at least one clock reference signal.

5. The clock recovery circuit of claim 4, further comprising:

a circuit generating said at least one clock reference signal.

6. The clock recovery circuit of claim 4, wherein said at least one signal from said plurality of phase detectors comprises a single signal.

7. The clock recovery circuit of claim 4, wherein said clock reference signal comprises a single signal.

* * * * *